United States Patent
Strumpell et al.

(10) Patent No.: US 6,204,085 B1
(45) Date of Patent: Mar. 20, 2001

(54) REDUCED DEFORMATION OF MICROMECHANICAL DEVICES THROUGH THERMAL STABILIZATION

(75) Inventors: Mark H. Strumpell; Judith C. Frederic; Michael R. Douglass, all of Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/392,136

(22) Filed: Sep. 8, 1999

Related U.S. Application Data

(60) Provisional application No. 60/100,450, filed on Sep. 15, 1998.

(51) Int. Cl.[7] .................................................. H01L 21/00
(52) U.S. Cl. ........................ 438/51; 438/52; 359/291; 359/224; 427/534; 134/1
(58) Field of Search ..................... 438/51, 52; 359/291; 427/534; 134/1

(56) References Cited

U.S. PATENT DOCUMENTS

| | | | |
|---|---|---|---|
| 5,061,049 | 10/1991 | Hornbeck | 359/224 |
| 5,498,657 | * 3/1996 | Sugiyama et al. | 524/463 |
| 5,583,688 | 12/1996 | Hornbeck | 359/291 |
| 6,024,801 | * 2/2000 | Wallace et al. | 134/1 |

* cited by examiner

Primary Examiner—Charles Bowers
Assistant Examiner—Asok Kumar Sarkar
(74) Attorney, Agent, or Firm—Charles A. Brill; Wade James Brady, III; Frederick J. Telecky, Jr.

(57) ABSTRACT

A method and system of reducing the permanent accumulated deformation of a deflectable member of a micromechanical device through thermal stabilization. The accumulated deformation is due to the repeated bending or twisting of a flexible component of the micromechanical deice typically the repetitive deformation of a flexible hinge connecting a rigid member to substrate. After the device is fabricated, passivated (316), and packaged (322), the packaged device is baked (326) at a temperature of at least 120° C. A 150° C. bake for 12 to 16 hours is preferred. Lower temperatures required longer baking periods.

18 Claims, 3 Drawing Sheets

REDUCED DEFORMATION OF MICROMECHANICAL DEVICES THROUGH THERMAL STABILIZATION

This application claims priority under 35 USC 119 (e)(1) of provisional application under number 06/100,450 filed Sep. 15,1998.

CROSS-REFERENCE TO RELATED APPLICATIONS

The following patents and/or commonly assigned patent applications are hereby incorporated herein by reference:

| Patent No. | Filing Date | Issue Date | Title |
| --- | --- | --- | --- |
| 5,061,049 | Sept. 13, 1990 | Oct. 29, 1991 | Spatial Light Modulator and Method |
| 5,583,688 | Dec. 21, 1993 | Dec. 10, 1996 | Multi-Level Digital Micromirror Device |

FIELD OF THE INVENTION

This invention relates to the field of micromechanical devices, more particularly to micromechanical devices having a deflectable member.

BACKGROUND OF THE INVENTION

Micromechanical devices are small structures typically fabricated on a semiconductor wafer using techniques such as optical lithography, doping, metal sputtering, oxide deposition, and plasma etching similar to those developed for the fabrication of integrated circuits.

Digital micromirror devices (MDs), sometimes referred to as deformable micromirror devices, are a type of micromechanical device. Other types of micromechanical devices include accelerometers, pressure and flow sensors, gears and motors. While some micromechanical devices, such as pressure sensors, flow sensors, and DMDs have found commercial success, other types have not yet been commercially viable.

Digital micromirror devices are primarily used in optical display systems. In display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Thin hinge structures, which restrict the deformation to a relatively small region of the device, limit the amount of light scattered and improve image quality.

Torsion beam devices enabled the use of dark field optical systems. Torsion beam devices use a thin metal layer to form a torsion beam, which is referred to as a hinge, and a thicker metal layer to form a rigid member, or beam, typically having a mirror-like surface. The rigid member or mirror is suspended by, and typically centered on, the torsion hinge-allowing the mirror to rotate by twisting the torsion hinge. Address electrodes are formed on the substrate beneath the mirror on either side of the torsion hinge axis. Electrostatic attraction between an address electrode and the mirror, which in effect form the two plates of an air gap capacitor, is used to rotate the mirror.

Recent micromirror configurations, called hidden-hinge designs, further improve the image contrast ratio by using an elevated mirror to block most of the light from reaching the torsion beam hinges. The elevated mirror is connected to an underlying torsion beam or yoke by a support post. The yoke is attached to the torsion hinges, which in turn are connected to rigid support posts. Because the structures that support the mirror and allow it to rotate are underneath the mirror instead of around the perimeter of the mirror, virtually the entire surface of the device is used to fabricate the mirror. Since virtually all of the light incident a hidden-hinge micromirror device reaches an active mirror surface-and is thus either used to form an image pixel or reflected away from the image to a light trap-the hidden-hinge device's contrast ratio is much higher than the contrast ratio of previous devices.

Images are created by positioning the DMD so that a light beam strikes the DMD at an angle equal to twice the angle of rotation. In this position, the mirrors fully rotated toward the light source reflect light in a direction normal to the surface of the micromirror device and into the aperture of a projection lens-transmitting light to a pixel on the image plane. Mirrors rotated away from the light source reflect light away from the projection lens-leaving the corresponding pixel dark.

Full-color images are generated either by using three micromirror devices to produce three single-color images, or by sequentially forming three single-color images using a single micromirror device illuminated by a beam of light passing through three color filters mounted on a rotating color wheel.

Micromirror devices are generally operated in one of two modes of operation. The first mode of operation is an analog mode, sometimes called beam steering, wherein the address electrode is charged to a voltage corresponding to the desired deflection of the mirror. Light striking the micromirror device is reflected by the mirror at an angle determined by the deflection of the mirror. Depending on the voltage applied to the address electrode, the cone of light reflected by an individual mirror is directed to fall outside the aperture of a projection lens, partially within the aperture, or completely within the aperture of the lens. The reflected light is focused by the lens onto an image plane, with each individual mirror corresponding to a fixed location on the image plane. As the cone of reflected light is moved from completely within the aperture to completely outside the aperture, the image location corresponding to the mirror dims, creating continuous brightness levels.

The second mode of operation is a digital mode. When operated digitally, each micromirror fully deflects in either of the two directions about the torsion beam axis directing the entire cone of reflected light either inside or outside the aperture of the projection lens. Thus, the digital mode either creates a maximum-brightness pixel or a minimum-brightness pixel. Intermediate brightness levels are created by pulse width modulation techniques in which the mirror is rapidly and repetitively rotated on and off. The duty cycle of the mirror determines the quantity of light reaching the image plane. The human eye integrates the light pulses and the brain perceives a flicker-free intermediate brightness level.

Digital operation uses a relatively large voltage to ensure the mirror is filly deflected. Since it is advantageous to drive the address electrode using standard logic voltage levels, a bias voltage, typically a negative voltage, is applied to the mirror metal layer to increase the voltage difference between the address electrodes and the mirrors. Use of a sufficiently large mirror bias voltage-a voltage above what is termed the threshold voltage of the device-ensures the mirror will deflect to the closest landing electrodes even in the absence of an address voltage. Therefore, by using a large mirror bias voltage, standard logic level address voltages may be used.

Typical images do not result in a 50/50 on/off duty cycle for the average micromirror. The unequal loading of the on and off states of a pixel results in a time average angle which produces a permanent deformation of the hinge. This deformation is seen as a permanent torsion, or twist, in the micromirror hinges. In the worst case, the hinge twist, or hinge memory, becomes so large that the force created by the address electrodes is insufficient to overcome the permanent twist. Long before the hinge twist is able to overcome the force generated by the address electrodes, however, the hinge twist degrades the image quality by occasionally overcoming the force generated by the address electrode.

When creating an image with the micromirror device, the micromirrors are rapidly switched on and off. Due to the resonant reset process used to ensure the micromirror releases from the surface of the landing electrodes, un-addressed mirrors tend to flutter about the neutral, or flat, position. Likewise, an addressed mirror flutters about the position determined by the address voltages-a position also influenced by hinge memory. Therefore, the hinge memory and the mirror flutter combine to overcome the force generated by the address electrodes and, depending on the timing of the mirror bias signal relative to the position of the fluttering micromirror, can intermittently cause improper device operation long before the hinge memory becomes large enough to consistently limit mirror rotation. Current micromirror designs are unacceptable when the hinge deformation produces a 4 degree deviation from the flat state.

The effects of hinge memory can be mitigated by the use of larger address voltages and by allowing the fluttering micromirror to settle before applying the mirror bias voltage. Unfortunately, each of these alternatives has a detrimental impact on the design and operation of micromechanical devices. Therefore, a method of eliminating or reducing hinge memory is needed.

SUMMARY OF THE INVENTION

Objects and advantages will be obvious, and will in part appear hereinafter and will be accomplished by the present invention which provides a method of reducing the permanent accumulated deformation of a deflectable member of a micromechanical device through thermal stabilization. The accumulated deformation is due to the repeated bending or twisting of a flexible component of the micromechanical device, typically the repetitive deformation of a flexible hinge connecting a rigid member to a substrate.

One embodiment of the claimed invention provides a method of minimizing the long-term accumulation of a permanent deflection in micromechanical device, comprising the steps of fabricating the device and baking the device at a temperature of at least 120° C., preferably at a temperature of 150° C. for between 12 and 16 hours.

Another embodiment of the claimed invention provides a method of fabricating a micromechanical device comprising the steps of providing a substrate, forming a deflectable member supported by said substrate, and baking said deflectable member at a temperature of at 120° C.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A new fabrication technique has been developed which greatly decreases the systematic deformation, or hinge memory, resulting from the operation of a micromechanical device. The new technique, which relies on a thermal stabilization of the device, greatly reduces the accumulated deformation.

Reduction of the accumulated deflection provides consistency of operation over the entire life-span of the micromechanical device. Although the invention will be discussed primarily in terms of a digital micromirror device-wherein the technique stabilizes the deformable torsion beam hinges-it should be understood that the technique also is applicable to virtually all forms of micromechanical devices which use an elastic member to allow a portion of the micromechanical device to move-especially devices that have a thin-film of sputter-deposited metal. For purposes of illustration and not as a limitation, the stabilization bake could also be used on micromechanical devices such as accelerometers and pressure and flow sensors.

The solution to the hinge memory problem is achieved by subjecting the device to a bake operation which stabilizes the torsion beam hinges. The bake operation, commonly referred to as a hinge-bake operation, uses a combination of time and temperature to achieve this result. Preferably, the micromirror device is enclosed in a hermetic, or semi-hermetic, package along with a surface passivation material, such as perfluorodecanoic acid (PFDA) prior to the hinge-bake operation.

Figure 1:
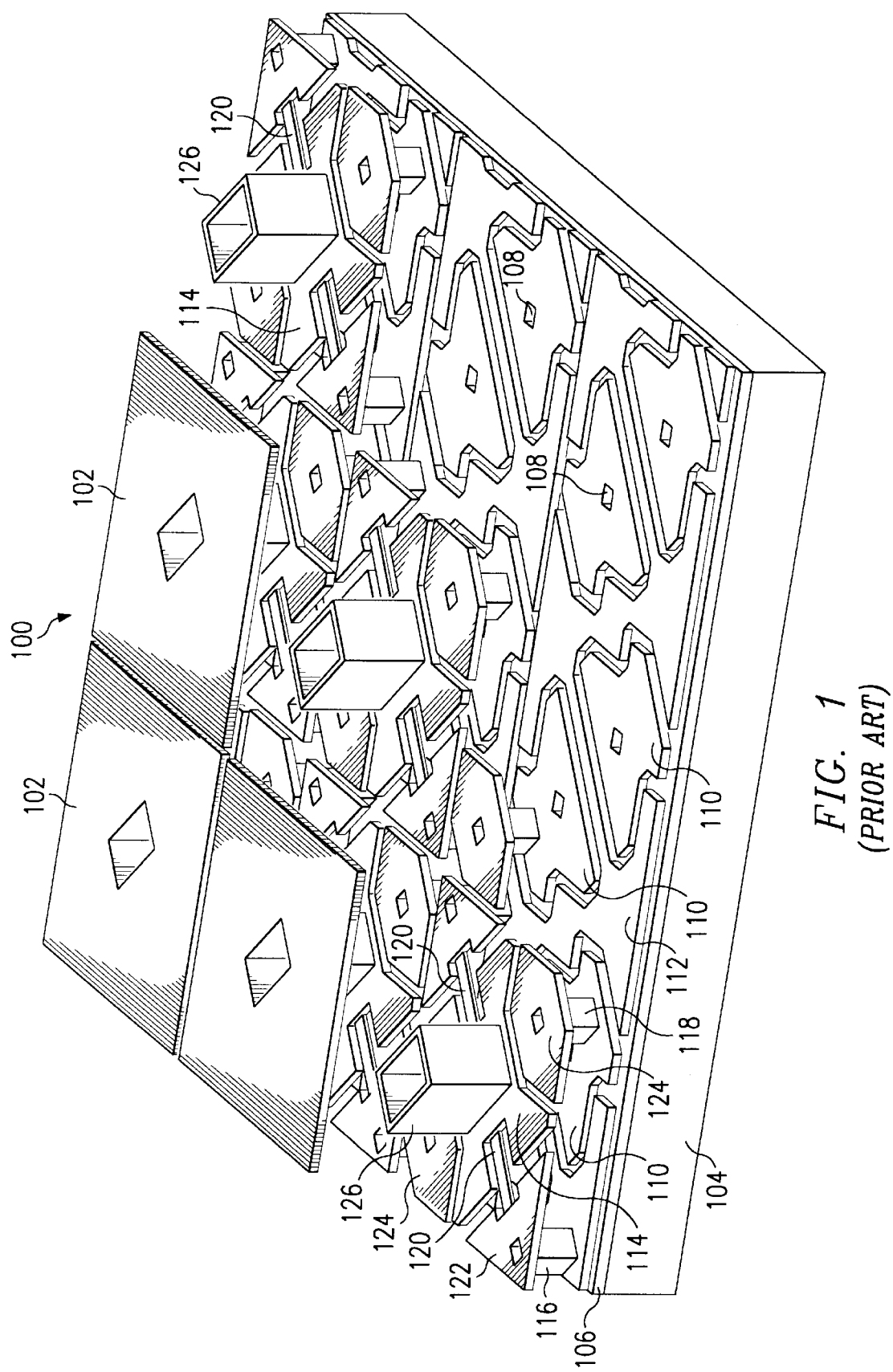
FIG. 1 is a perspective view of a small portion of a micromirror array of the prior art.
Figure 2:
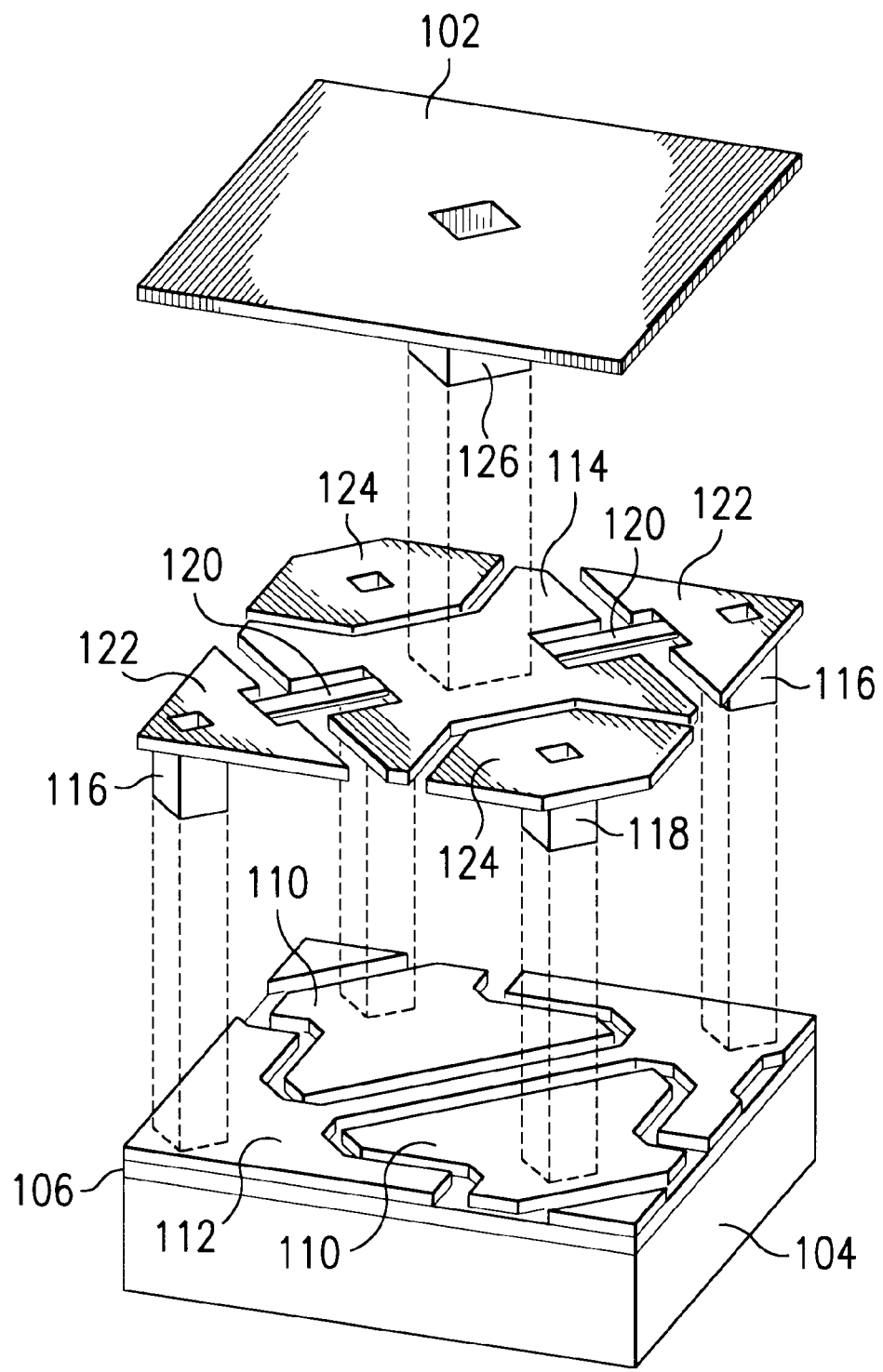
FIG. 2 is an exploded perspective view of a single micromirror element from the micromirror of FIG. 1.

A typical hidden-hinge DMD 100 is an orthogonal array of DMD cells, or elements. This array often includes more than a thousand DMD rows and columns of DMD cells. FIG. 1 shows a small portion of a DMD array of the prior art with several mirrors 102 removed to show the underlying mechanical structure of the DMD array. FIG. 2 is an exploded view of a single DMD element of the prior art further detailing the relationships between the DMD structures.

A DMD is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the DMD substrate, or may be external to the DMD. Image processing and formatting logic is also formed in the substrate 104 of some designs. For the purposes of this disclosure, addressing circuitry is considered to include any circuitry, including direct voltage connections and shared memory cells, used to control the direction of rotation of a DMD mirror.

Some DMD configurations use a split reset configuration which allows several DMD elements to share one memory cell-thus reducing the number of memory cells necessary to operate a very large array, and making more room available for voltage driver and image processing circuitry on the DMD integrated circuit. Split reset is enabled by the bistable operation of a DMD, which allows the contents of the underlying memory to change without affecting the position of the mirror 102 when the mirror has a bias voltage applied.

The silicon substrate 104 and any necessary metal interconnection layers are isolated from the DMD superstructure by an insulating layer 106 which is typically a plasma deposited oxide. This layer is planarized by a chemical/mechanical polish (CMP) to provide an optically flat surface upon which to build the DMD superstructure. Holes or vias 108 are opened in the oxide layer to allow electrical connection between the DMD superstructure and the electronic circuitry formed in the substrate 104. Vias 108 are called Via2 because there is an earlier via layer formed in the underlying electronic circuitry.

The first layer of the superstructure is a metallization layer. Because two metallization layers are typically required to interconnect the circuitry fabricated on the substrate, the first layer of the superstructure is typically the third metallization layer, often called Metal3. The Metal3 metallization layer is deposited on the insulating layer 106 and patterned to form address electrodes 110 and a mirror bias connection 112. The address electrodes 110 are electrically connected to the underlying electronic circuitry through via 108.

Some micromirror designs have landing electrodes which are separate and distinct from, but electrically connected to, the mirror bias connection 112. Landing electrodes limit the rotation of the mirror 102 and prevent the rotated mirror 102 and torsion hinge yoke 114 from touching the address electrodes 110, which have a voltage potential relative to the mirror 102. If the mirror 102 contacts the address electrodes 110, the resulting short circuit could fuse the torsion hinges 120 or weld the mirror 102 to the address electrodes 110, in either case ruining the DMD.

Since the same voltage is always applied to both the landing electrodes and the mirrors 102, the mirror bias connection and the landing electrodes are preferably combined in a single structure when possible. The mirror bias connection 112 typically includes regions called landing sites which mechanically limit the rotation of the mirror 102 or a hinge yoke 114. These landing sites are often coated with a material chosen to reduce the tendency of the mirror 102 and torsion hinge yoke 144 to stick to the landing site.

Mirror bias/reset voltages travel to each mirror 102 through the mirror bias/reset conductor, typically a mirror bias/reset metallization layer 112. Split reset designs require the array of mirrors to be subdivided into multiple subarrays each having an independent mirror bias connection. The landing electrode/mirror bias 112 configuration shown in FIG. 1 is ideally suited to split reset applications since the DMD elements are easily segregated into electrically isolated rows or columns simply by isolating the mirror bias/reset layer between the subarrays. The mirror bias/reset layer of FIG. 1 is shown divided into rows of isolated elements.

A first layer of supports, typically called spacervias, is fabricated on the metal layer forming the address electrodes 110 and mirror bias connections 112. These spacervias, which include both hinge support spacervias 116 and upper address electrode spacervias 118, are typically formed by spinning a thin spacer layer over the address electrodes 110 and mirror bias connections 112. This thin spacer layer is typically a 1 $\mu$m thick layer of positive photoresist. After the photoresist layer is deposited, it is exposed, developed, and deep UV hardened to form holes in which the spacervias will be formed. This spacer layer and a thicker spacer layer used later in the fabrication process are often called sacrificial layers since they are used only as forms during the fabrication process and are removed from the device prior to device operation.

A thin layer of metal is sputtered onto the spacer layer and into the holes. An oxide is then deposited over the thin metal layer and patterned to form an etch mask over the regions that later will form hinges 120. A thicker layer of metal, typically an aluminum alloy, is sputtered over the thin layer and oxide etch masks. Another layer of oxide is deposited and patterned to define the hinge yoke 114, hinge cap 122, and the upper address electrodes 124. After this second oxide layer is patterned, the two metals layers are etched simultaneously and the oxide etch stops removed to leave thick rigid hinge yokes 114, hinge caps 122, and upper address electrodes 124, and thin flexible torsion beams 120.

A thick spacer layer is then deposited over the thick metal layer and patterned to define holes in which mirror support spacervias 126 will be formed. The thick spacer layer is typically a 2.4 $\mu$m thick layer of positive photoresist. A layer of mirror metal, typically an aluminum alloy, is sputtered on the surface of the thick spacer layer and into the holes in the thick spacer layer. This metal layer is then patterned to form the mirrors 102 and both spacer layers are removed using a plasma etch process known as an undercut.

Once the two spacer layers have been removed, the deflectable element including the mirror is free to rotate about the axis formed by the torsion hinge. The wafer is coated with a passivation material, preferably PFDA, to reduce the tendency of the deflectable element to stick to the landing sites on the mirror bias/reset metallization layer. The devices are functionally tested using a probe, and the wafer is separated into individual dies.

The functional devices are bonded to a ceramic package substrate. Bond wires are connected between bond pads on the device and the package substrate. A getter, used to trap contaminants including water, is added to the package-often to the inside of the glass window-prior to attaching the window to the package. Finally, a metal framed glass window is welded or epoxied onto the package above the active mirror region, hermetically or semi-hermetically sealing the device inside the package. The packaged device is then baked, at a temperature of 100° C., for 24 hours. This bake cycle improves the effectiveness of the passivation layer.

An additional bake cycle, called a "hinge bake," has been discovered to improve the operation of the device and extend the device's operating lifetime by stabilizing the torsion beams and decreasing the tendency of the torsion beams to develop a permanent set, or twist, after repeated operation of the devices. The stabilization is believed to be due to a combination of stress relief and surface passivation of the torsion beam hinges. The stress relief and surface passivation reduces metal creep during device operation which in turn reduces the amount of permanent deflection accumulated by the moving components.

As described above, as the torsion beam hinges develop a permanent twist in a first direction, the voltage required to twist the hinges in the other direction increases. While new devices have sufficient address margin to ensure all of the deflectable elements are properly rotated, as the devices age this margin is reduced and eventually eliminated. Once the address margin is eliminated, at least some of the mirrors will only operate in one direction. This results in image pixels being permanently on or off and degrades the image projected by the micromirror device. Non-DMD micromechanical devices will experience similar failures as their flexible components begin to develop permanent deflections.

The minimum temperature and time required to perform the hinge bake process depends on the torsion beam hinge material and the chemicals to which it is exposed during the fabrication of the device. Standard aluminum alloy DMD hinges require a minimum temperature of at least 120° C. Elevating the temperature to 150° C. requires a minimum of 12 hours, with optimum results requiring a 24 hour bake. Higher temperatures allow shorter bake times, and longer bake times allow lower temperatures. The preferred hinge bake is 150° C. for 12 to 16 hours. Process variables are determined through experimentation using lifetime failure testing to determine the improvement provided by various combinations of time and temperature. The hinge bake process not only stabilizes the torsion hinges and limits the accumulation of hinge twist, it also bakes the passivation layer enough to eliminate the need for a separate passivation bake step.

The standard fabrication process resumes after the hinge bake operation. The completed devices are subjected to an operational burn-in cycle, for example 48 hours at 65° C., prior to being tested and shipped. During the burn-in cycle the completed DMD arrays are operated for 48 hours at 65° C. After burn-in the DMDs are tested and the working arrays packaged and sold.

Figure 3:
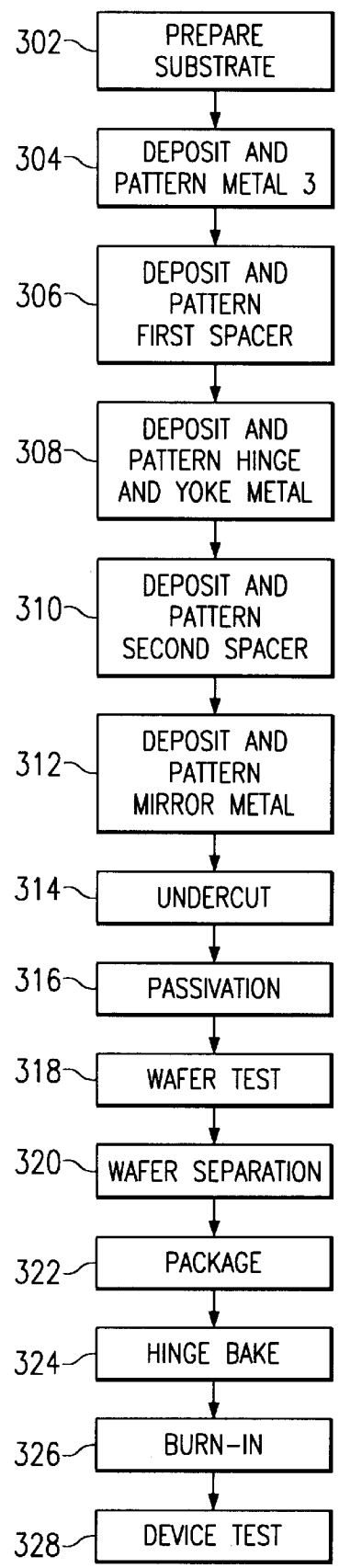
FIG. 3 is a flowchart showing the steps necessary to fabricate, package, passivate, and stabilize a micromechanical device according to one embodiment of the present invention.

FIG. 3 summarizes the improved fabrication process described above. As shown in FIG. 3, the substrate is prepared in step 302. Preparing the substrate includes fabricating electronic circuitry on the substrate along with the first two layers of metal interconnections and a protective oxide layer. After the protective oxide layer is deposited and polished, the first metallization layer of the DMD superstructure, typically called Metal3, is deposited and patterned to form the address electrodes and mirror bias/reset metallization in process step 304. Step 304 also includes the step of opening vias through protective oxide layer to allow interconnections between the underlying electronic circuitry and the Metal3 layer.

Process step 306 represents the deposition and patterning of the first spacer layer. After the first spacer layer is formed, metal layers are deposited and patterned to form the torsion beam hinges and hinge yokes in process step 308. Metal deposited during process step 308 also forms the torsion beam hinge support posts.

A second sacrificial spacer layer is spun over the torsion beam hinge and hinge yoke metal layers during process step 310. The second spacer layer provides a planar surface on which to deposit the mirror and is patterned to open vias for the mirror support spacervia. Process step 312 represents the deposition and patterning steps necessary to form the micromirrors. After the micromirror metal layer is deposited and patterned, the two sacrificial spacer layers are removed during the undercut process shown as step 314.

The completed devices are then passivated, tested, and separated in steps 316, 318, and 320. The functional devices are then packaged in process step 322 prior to undergoing the new hinge bake process step 324. The devices are then burned-in 326 and retested 328 prior to being shipped. The hinge bake process may also be performed at other points in the process flow, but it is most effective after the packaging step 322.

As a result of the hinge-bake process disclosed herein, experiments have shown a 60 to 70% reduction in systematic torsion when operated in a 95/5 duty cycle at temperatures between 65° and 95 ° C., as well as improvements at lower temperatures. Thus the hinge-bake operation improves the reliability of the device and extends the life-time and potential operating environment of the device.

An unexpected side-effect of the hinge-bake process is a reduction in the stiction between the deflectable member and the landing sites on the mirror bias/reset metallization layer due to an improvement in the device passivation layer. Devices baked as described herein continue to operate well beyond similar devices which have not undergone a bake cycle.

Thus, although there has been disclosed to this point a particular embodiment for a method of reducing hinge memory through thermal stabilization, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of preventing the long-term accumulation of a permanent deflection in micromechanical device, said method comprising the steps of:

fabricating said device; and baking said device at a temperature of at least 120° C.

2. The method of claim 1, wherein said baking step comprises the step of baking said device for a minimum of 12 hours.

3. The method of claim 1, wherein said baking step comprises the step of baking said device for 24 hours.

4. The method of claim 1, wherein said baking step comprises the step of baking said device at a temperature of 150° C.

5. The method of claim 1, wherein said baking step comprises the step of baking said device at a temperature of 150° C. between 12 and 16 hours.

6. The method of claim 1, wherein said device is non-operational during said baking step.

7. The method of claim 1, wherein said fabricating step comprises the step of fabricating a micromechanical mirror array.

8. The method of claim 1, wherein said fabricating step comprises the step of fabricating an accelerometer.

9. The method of claim 1, wherein said fabricating step comprises the step of fabricating a pressure sensor.

10. The method of claim 1, wherein said fabricating step comprises the step of fabricating a flow sensor.

11. A method of fabricating a micromechanical device, said method comprising the steps of:

provide a substrate;

forming a deflectable member supported by said substrate; and baking said deflectable member at a temperature of at least 120° C.

12. The method of claim 11, wherein said baking step comprises the step of baking said deflectable member for a minimum of 12 hours.

13. The method of claim 11, wherein said baking step comprises the step of baking said deflectable member for 24 hours.

14. The method of claim 11, wherein said baking step comprises the step of baking said deflectable member at a temperature of 150° C.

15. The method of claim 11, wherein said baking step comprises the step of baking said deflectable member at a temperature of 150° C. between 12 and 16 hours.

16. The method of claim 11, wherein said device is non-operational during said baking step.

17. The method of claim 11, said forming step further comprising the steps of:

depositing a first metal layer on said substrate;

depositing a first spacer layer over said first metal layer;

depositing at least one intermediate metal layer over said first spacer layer;

depositing a second spacer layer over said at least one intermediate metal layer;

depositing another metal layer over said second spacer layer; and removing said first and second spacer layers.

18. The method of claim 17, said forming step further comprising the steps of:

passivating said device; and packaging said device.

* * * * *